(12) United States Patent
Chen et al.

(10) Patent No.: US 12,249,599 B2
(45) Date of Patent: Mar. 11, 2025

(54) MULTIPLE CHIP MODULE TRENCHED LID AND LOW COEFFICIENT OF THERMAL EXPANSION STIFFENER RING

(71) Applicant: Apple Inc., Cupertino, CA (US)

(72) Inventors: Wei Chen, Union City, CA (US); Jie-Hua Zhao, Cupertino, CA (US); Jun Zhai, Cupertino, CA (US); Po-Hao Chang, Kaohsiung (TW); Hsien-Che Lin, Hsinchu (TW); Ying-Chieh Ke, New Taipei (TW); Kunzhong Hu, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 18/194,236

(22) Filed: Mar. 31, 2023

(65) Prior Publication Data
US 2023/0317708 A1   Oct. 5, 2023

Related U.S. Application Data

(63) Continuation of application No. 17/013,279, filed on Sep. 4, 2020, now Pat. No. 11,646,302.

(60) Provisional application No. 63/002,888, filed on Mar. 31, 2020.

(51) Int. Cl.
*H01L 25/18* (2023.01)
*H01L 23/24* (2006.01)

(52) U.S. Cl.
CPC .............. *H01L 25/18* (2013.01); *H01L 23/24* (2013.01)

(58) Field of Classification Search
CPC .............................. H01L 25/18; H01L 23/24
See application file for complete search history.

(56) References Cited

U.S. PATENT DOCUMENTS

| | | | |
|---|---|---|---|
| 5,881,945 | A | 3/1999 | Edwards et al. |
| 6,437,436 | B2 | 8/2002 | Wang et al. |
| 6,486,562 | B1 | 11/2002 | Kato |
| 7,168,484 | B2 | 1/2007 | Zhang et al. |
| 7,440,281 | B2 | 10/2008 | Bailey et al. |
| 7,585,702 | B1 | 9/2009 | Wang et al. |
| 7,704,798 | B2 | 4/2010 | Hua et al. |
| 7,728,440 | B2 | 6/2010 | Honda |
| 8,063,482 | B2 | 11/2011 | Lu |
| 8,299,633 | B2 | 10/2012 | Su |

(Continued)

FOREIGN PATENT DOCUMENTS

| | | |
|---|---|---|
| JP | 2010-103338 A | 5/2010 |
| TW | 200618214 A | 6/2006 |

(Continued)

OTHER PUBLICATIONS

PCT/US2021/017445, "PCT Invitation to Pay Additional Fees and, Where Applicable, Protest Fee", mailed Jun. 2, 2021, 14 pages.

(Continued)

*Primary Examiner* — Peniel M Gumedzoe
(74) *Attorney, Agent, or Firm* — Aikin & Gallant, LLP (57) ABSTRACT

Multiple chip module (MCM) structures are described. In an embodiment, a module includes a first and second components on the top side of a module substrate, a stiffener structure mounted on the top side of the module substrate, and a lid mounted on the stiffener structure and covering the first component and the second component. The stiffener is joined to the lid within a trench formed in a roof of the lid.

16 Claims, 12 Drawing Sheets

(56) References Cited

U.S. PATENT DOCUMENTS

| | | | |
|---|---|---|---|
| 10,043,730 B2 | 8/2018 | Refai-Ahmed et al. |
| 10,163,754 B2 | 12/2018 | Ho et al. |
| 10,643,924 B1 | 5/2020 | Shen |
| 10,685,920 B2 | 6/2020 | Yew et al. |
| 10,910,790 B2 | 2/2021 | Kim et al. |
| 11,646,302 B2 | 5/2023 | Chen et al. |
| 11,749,631 B2 | 9/2023 | Chen et al. |
| 2001/0023533 A1 | 9/2001 | Sylvester |
| 2003/0230800 A1 | 12/2003 | Akai |
| 2004/0238827 A1 | 12/2004 | Takayama et al. |
| 2005/0127502 A1 | 6/2005 | Lee et al. |
| 2005/0184404 A1 | 8/2005 | Huang et al. |
| 2006/0076648 A1 | 4/2006 | Gally et al. |
| 2008/0203558 A1 | 8/2008 | Tashiro et al. |
| 2010/0096747 A1 | 4/2010 | Kusano |
| 2011/0149537 A1 | 6/2011 | Kurosawa |
| 2012/0007229 A1 | 1/2012 | Bartley et al. |
| 2012/0182694 A1 | 7/2012 | Lin et al. |
| 2012/0241944 A1 | 9/2012 | Beaumier et al. |
| 2013/0001740 A1 | 1/2013 | Ma |
| 2013/0242496 A1 | 9/2013 | Ahmad et al. |
| 2014/0061893 A1 | 3/2014 | Saeidi et al. |
| 2014/0091461 A1 | 4/2014 | Shen |
| 2014/0331777 A1 | 11/2014 | Tomita |
| 2015/0001701 A1 | 1/2015 | Li et al. |
| 2015/0021754 A1 | 1/2015 | Lin et al. |
| 2015/0155221 A1 | 6/2015 | Chen et al. |
| 2015/0162307 A1 | 6/2015 | Chen et al. |
| 2015/0179607 A1 | 6/2015 | Ho et al. |
| 2015/0187679 A1 | 7/2015 | Ho et al. |
| 2015/0206851 A1 | 7/2015 | De Sousa et al. |
| 2015/0357258 A1 | 12/2015 | Fitzgerald et al. |
| 2016/0035637 A1 | 2/2016 | Urago et al. |
| 2017/0092619 A1 | 3/2017 | Refai-Ahmed et al. |
| 2017/0372979 A1* | 12/2017 | Gandhi .............. H01L 23/3675 |
| 2018/0068916 A1 | 3/2018 | Iruvanti et al. |
| 2018/0350712 A1 | 12/2018 | Thanu et al. |
| 2019/0327859 A1 | 10/2019 | Iyengar et al. |
| 2020/0194335 A1 | 6/2020 | Eid et al. |
| 2020/0402882 A1 | 12/2020 | Kim et al. |
| 2021/0118756 A1 | 4/2021 | Wan et al. |
| 2021/0233949 A1 | 7/2021 | Chino et al. |
| 2021/0366861 A1 | 11/2021 | Chen et al. |
| 2023/0062454 A1 | 3/2023 | Chen et al. |

FOREIGN PATENT DOCUMENTS

| | | |
|---|---|---|
| TW | 200631140 A | 9/2006 |
| WO | 2019005154 A1 | 1/2019 |
| WO | 2019066993 A1 | 4/2019 |

OTHER PUBLICATIONS

PCT/US2021/017445, "Notification of Transmittal of the International Search Report and the Written Opinion of the International Searching Authority, or the Declaration", mailed Jul. 20, 2021, 22 Pages.

PCT/US2022/074965, "PCT Notification of Transmittal of the International Search Report and the Written Opinion of the International Searching Authority, or the Declaration", mailed Dec. 7, 2022, 11 pages.

* cited by examiner

MULTIPLE CHIP MODULE TRENCHED LID AND LOW COEFFICIENT OF THERMAL EXPANSION STIFFENER RING

RELATED APPLICATIONS

This application is a continuation of co-pending U.S. patent application Ser. No. 17/013,279, filed Sep. 4, 2020, which claims the benefit of priority of U.S. Provisional Patent Application Ser. No. 63/002,888 filed on Mar. 31, 2020, the full disclosures of which are incorporated herein by reference.

BACKGROUND

Field

Embodiments described herein relate to multiple chip modules, and in particular to lids thereof.

Background Information

Lids are widely used in multiple chip modules (MCMs) for a variety of reasons, such as to provide mechanical integrity, hermetic sealing from environment, and thermal performance. In an exemplary implementation one or more components are surface mounted onto a module substrate, and then optionally underfilled. A lid is then secured onto the module substrate and over the component(s).

SUMMARY

Embodiments describe multiple chip module (MCM) structures in which a combination of lid and stiffener structure is made to obtain the mechanical integrity and thermal benefits of a lid, and reduced warpage provided by the stiffener structure. In particular, the stiffener structure may reduce warpage potentially caused by mismatch of the coefficient of thermal expansion (CTE) of the lid and the rest of the MCM. Various lid designs are described which can further mitigate stress and warpage including trench designs to increase the volume ratio of the stiffener structure to lid, multiple piece lids, and hybrid lids.

DETAILED DESCRIPTION

While lids can provide mechanical integrity to an MCM, it has been observed that lids can also induce large stress and high warpage in an MCM and induce mechanical failures. For example, lids formed of copper may have a comparatively high coefficient of thermal expansion (CTE) relative to other module features. This can result in thermal expansion and induce stress and warpage in the MCM components (e.g. packages) when the lid is strongly coupled with the rest of the module. In particular, it has been observed that mold cracks can generate between overmolded side-by-side dies, which can be exacerbated by stress induced by a lid. In accordance with embodiments, various combinations of lids and stiffener structures (also referred to as stiffener rings) are provided to balance the ability of the lid to provide mechanical integrity of the module while not inducing mechanical failure.

In an accordance with embodiments the lid can include a trenched design. The trenched designs may include sufficient lid volume on top of the module components to retain sufficient thermal performance, while volume of the lid is reduced at connection areas to further reduce stress and warpage caused by the lid. In some embodiments a reduction of volume of the lid can correspond to an increase in volume of a stiffener structure, which increases the volume ratio of the stiffener structure to lid. This can further provide feasibility of selecting the stiffener structure material(s) to reduce the stress and warpage in the MCM.

In accordance with embodiments the stiffener structure (e.g. ring) can be fully or partially formed of a low CTE material. In this aspect an increase of the stiffener structure to lid volume ratio (e.g. due to trenched lid design) facilitates the ability to reduce the effective CTE of the lid-stiffener combination by selecting a stiffener material with a lower CTE than the lid. A reduction of effective CTE of the lid-stiffener structure in turn can reduce stress and warpage issues of the MCM. In an exemplary implementation a low CTE stiffener material can be a nickel-iron alloy (FeNi36), iron-nickel-cobalt alloy (sold under the trademark KOVAR, trademark of CRS Holdings, Inc., Delaware), iron-nickel alloy (Alloy42), stainless steels (SUS410, SUS430), etc. while the lid is formed of a higher CTE material such as copper.

In accordance with embodiments multiple piece lid designs are described. The multiple piece lid designs may reduce the coupling effect of the lid to the rest of the module, and further reduce stress caused by the lid. This may include a reduction of die-to-die molding compound stress, and module warpage. In some embodiments, the multiple piece lid design incorporates different lid materials to meet different mechanical and thermal requirements of the MCMs. Hybrid lid designs are also described in which lids of different materials are bonded together or embedded, one within the other. By combining different materials, the effective CTE and stiffness of the lid can be tuned to match the target mechanical and thermal performance.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "above", "over", "to", "between", "spanning" and "on" as used herein may refer to a relative position of one layer with respect to other layers. One layer "above", "over", "spanning" or "on" another layer or bonded "to" or in "contact" with another layer may be directly in contact with the other layer or may have one or more intervening layers. One layer "between" layers may be directly in contact with the layers or may have one or more intervening layers.

Figure 1:
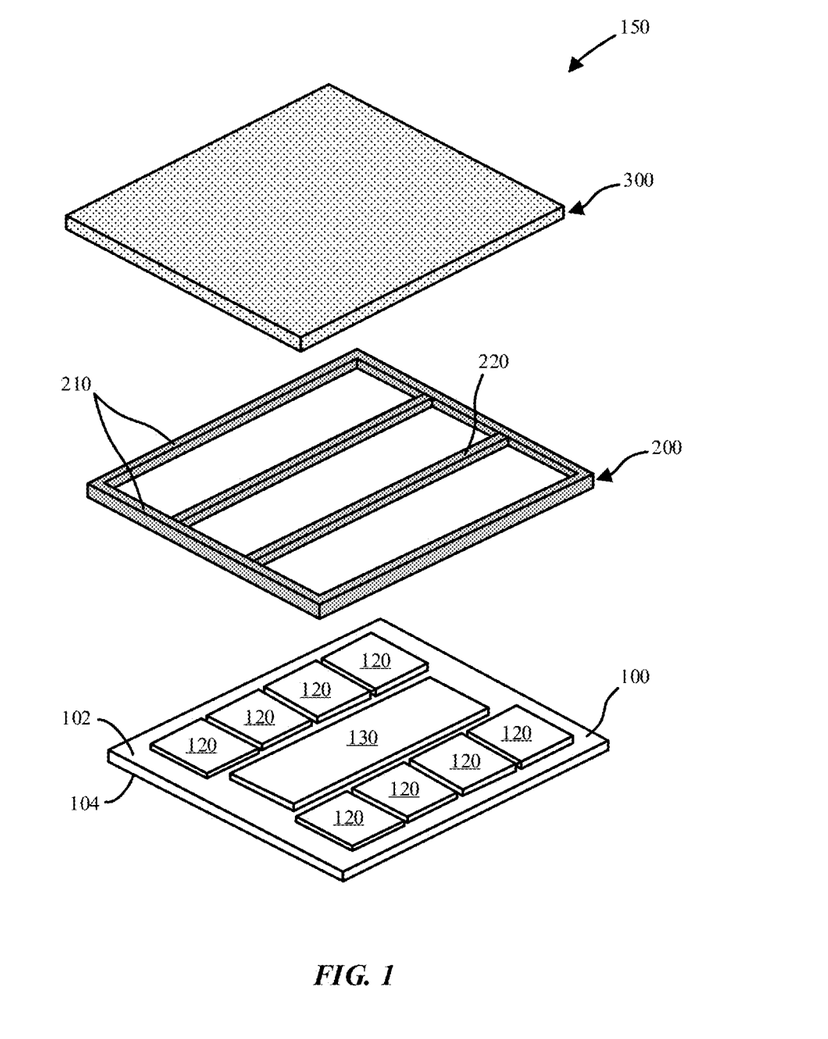
FIG. 1 is an exploded isometric view illustration of a multiple chip module including a lid and stiffener structure with inner and outer support structures in accordance with an embodiment.

Referring now to FIG. 1 a cross-sectional side view illustration is provided of an MCM 150 including a lid 300 and stiffener structure 200 with inner and outer supports 220, 210, respectively. In the exemplary embodiment, the MCM 150 includes a module substrate 100 including a top side 102 and bottom side 104. A plurality of first components 120 can be mounted on the top side 102 of the module substrate 100. First components 120 may be active or passive devices, and may be chips or packages. For example, first components 120 may be memory packages, such as dynamic random-access memory (DRAM) including one or more dies, which can be stacked dies, or side-by-side. In an embodiment, first components are chip scale packages. First components 120 can additionally be different types of components, and need not be identical. One or second components 130 can also be mounted on the top side 102 of the module substrate 100. In an embodiment, a second component 130 is a package that includes a plurality (e.g. two or more) of side-by-side dies. For example, second component 130 may include a plurality of side-by-side logic, or system on chip dies.

Figure 2A:
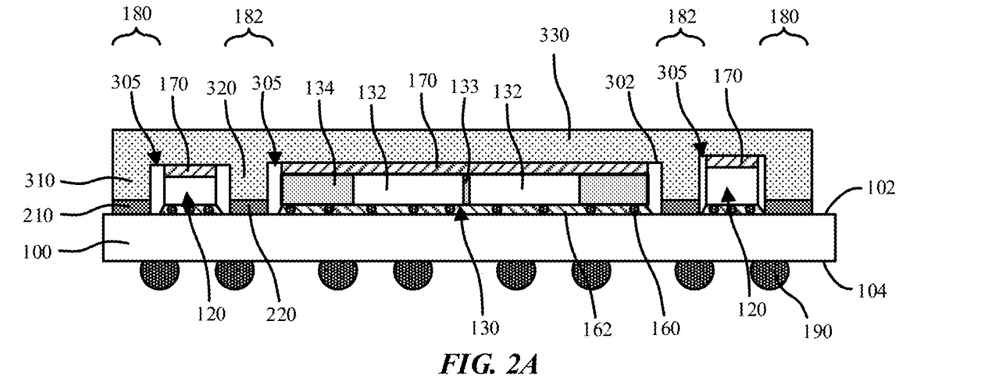
FIG. 2A is a schematic cross-sectional side view illustration of a lid design on an inner and outer support in accordance with an embodiment.
Figure 2B:
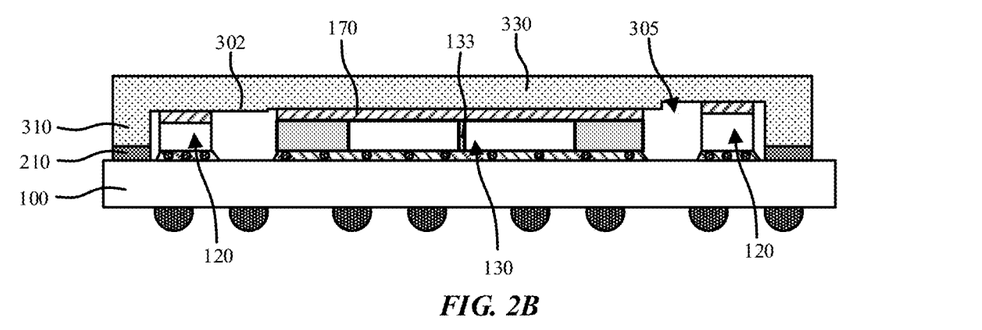
FIG. 2B is a schematic cross-sectional side view illustration of a lid design on an outer support in accordance with an embodiment.
Figure 2C:
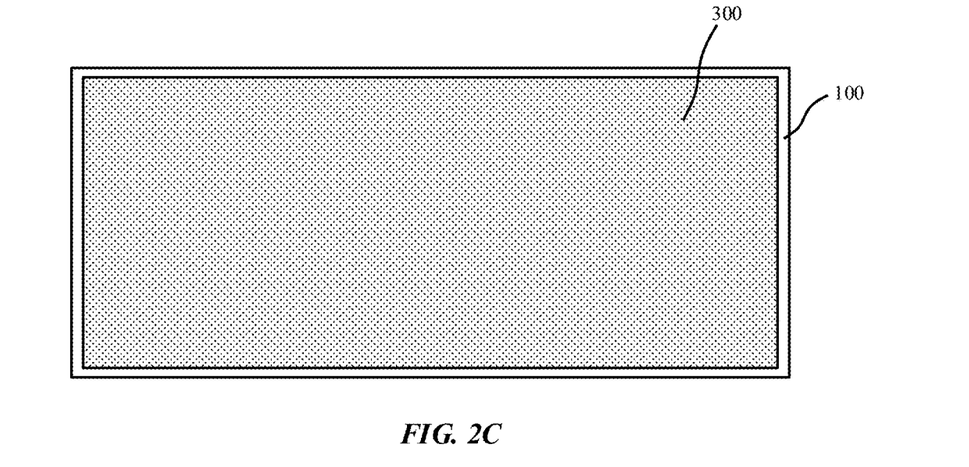
FIG. 2C is a schematic top view illustration of the lid design over a module substrate in accordance with an embodiment.

Referring now to FIGS. 2A-2C schematic cross-sectional side view and top view illustrations are provided of lid and stiffener structure arrangements in accordance with embodiments. In an exemplary implementation, first components 120 and second component 130 are surface mounted onto the module substrate 100 using any suitable technique such as solder bumps 160, with optional underfill 162 (e.g. epoxy). In the illustrated embodiment, the second component 130 is a package that includes a plurality of side-by-side dies 132 incapsulated in a molding compound 134. As shown, the space 133 laterally between the dies 132 may be filled with molding compound 134. It has been observed this can be a high stress location within the MCM due to close proximity of a variety of materials and MCM structures.

A thermal interface material (TIM) 170 can be located on top sides of the first components 120 and second component 130 in order to secure to the lid 300. TIM 170 may be applied using any suitable technique such as dispensing or tape. Exemplary TIM 170 materials include, but are not limited to, thermal grease, solder, metal filled polymer matrix, etc.

In accordance with embodiments the lid 300 can be bonded to an intermediate stiffener structure 200 (also referred to as a stiffener ring), which in turn is bonded to the module substrate 100. The stiffener structure 200 and lid 300 can be bonded using an adhesive material. For example, and adhesive can be dispensed onto the module substrate 100 at the connection areas (e.g. outer connection area 180 and inner connection area 182), followed by mounting the stiffener structure 200. Exemplary adhesive materials include glass paste, epoxies, urethane, polyurethane, silicone elastomers, etc. The lid 300 can similarly be bonded to the stiffener structure 200 after mounting the stiffener structure on the module substrate 100, or before.

As illustrated the lid 300 may include a roof 330, outer (periphery) walls 310 and optionally inner walls 320. The bottom surface 302 of the roof may be bonded to the TIM 170 on top of the second component 130 and first components 120. Contour of the bottom surface 302 (thickness of the roof 330) can be adjusted to evenly mate with the TIM 170 for the various first components 120 and second component 130. The outer walls 310 and inner walls 320 can extend from the roof 330 (e.g. protrude from the bottom surface) to form one or more cavities 305 which accommodate the second component 130 and first components 120. In accordance with embodiments, the stiffener structure 200 is shaped to mate with the outer walls 310 and inner walls 320 of the lid 300. Specifically, the stiffener structure 200 can include outer support (walls) 210 and inner support 220 (walls). Outer support 210 and inner support 220 may be integrally formed of the same material. Alternatively, outer support 210 and inner support 220 can be formed of different materials with different CTE. A variety of additional configurations, with different materials are possible. The mating surfaces between the stiffener structure 200 and lid 300 may have a same surface area. A plurality of module solder bumps 190 may optionally be applied to the bottom side 104 of the module substrate 100 for further integration.

In accordance with embodiments, various combinations of lids and stiffener structures are provided to balance the ability of the lid to provide mechanical integrity to the module while not inducing mechanical failure. In particular, various combinations of trenched lid designs, ratios of stiffener structure to lid volume, multiple piece lid designs, and combinations of materials with different CTE are described.

Referring now to FIGS. 3-9 various trenched lid designs and stiffener structures are illustrated in accordance with embodiments. As shown, the MCM 150 may include a module substrate 100, a first component 120 on the top side 102 of the module substrate and a second component 130 on the top side 102 of the module substrate. A stiffener structure 200 is mounted on the top side 102 of the module substrate and a lid 300 is mounted on the stiffener structure 200 and covering both the first component 120 and the second component 130. In accordance with various embodiments, the stiffener structure 200 may be joined to the lid 300 within a trench 315 formed in a roof 330 of the lid. The stiffener structure 200 can include either or both of an outer support 210 and an inner support 220.

Figure 3:
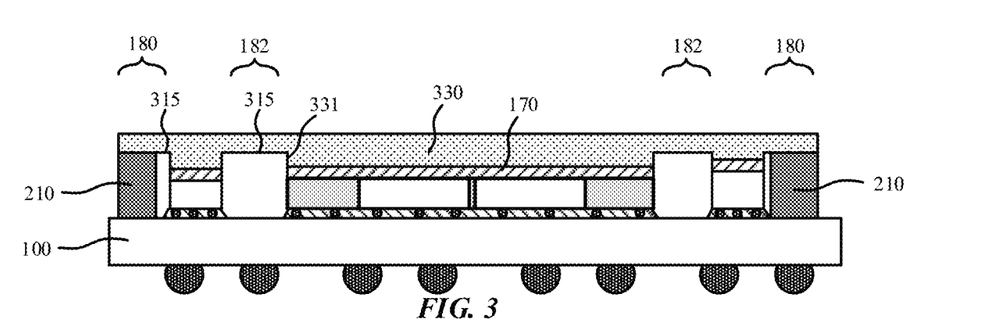
FIG. 3 is a schematic cross-sectional side view illustration of a trenched design of a lid on an outer support in accordance with an embodiment.

FIG. 3 is a schematic cross-sectional side view illustration of a trenched design of a lid on an outer support 210 in accordance with an embodiment. As shown, a trench 315 is formed in the bottom surface 302 of the roof 330 of the lid 300. Each trench 315 may include one or more trench edges (sidewalls) 331 in the roof 330. In this manner, a thickness of the roof 330 in the trench 315 area is less than a thickness of the roof 330 where the lid 300 is connected to the second component 130 with TIM 170, and where the lid 300 is connected to the first components 120 with TIM. Thus, the trench 315 reduces the volume of the lid 300 at the connection area. Specifically, the trench 315 is formed at the outer (periphery) connection area 180 where the trench is joined with the outer support (walls) 210 of the stiffener structure 200. In this illustration the trench does not include outer sidewalls (trench edge). In the illustrated embodiment the outer support 210 is joined to the lid 300 within the trench 315. While not illustrated, the lid 300 may additionally include an inner wall 320 joined to an inner support 220 of the stiffener structure 200.

Figure 4:
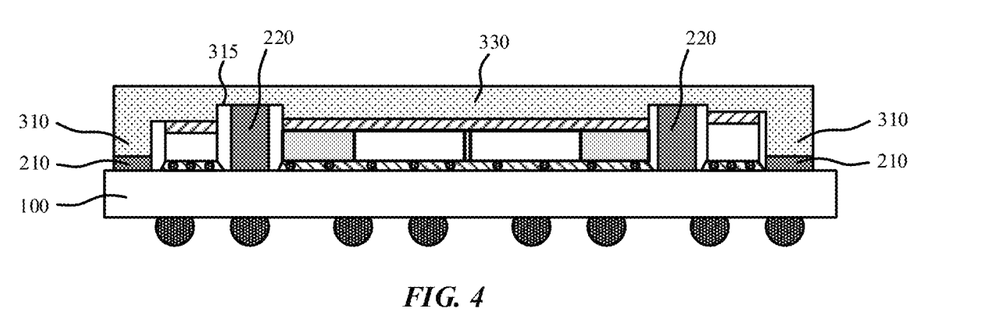
FIG. 4 is a schematic cross-sectional side view illustration of a partial trenched design of a lid on an inner support in accordance with an embodiment.

FIG. 4 is a schematic cross-sectional side view illustration of a partial trenched design of a lid on an inner support in accordance with an embodiment. As shown, the inner support 220 is joined to the lid 300 within the trench 315. Additionally, the lid 300 includes an outer wall 310 joined to the outer support 210. In the illustrated embodiment the inner support 220 is taller than the outer support 210.

Figure 5:
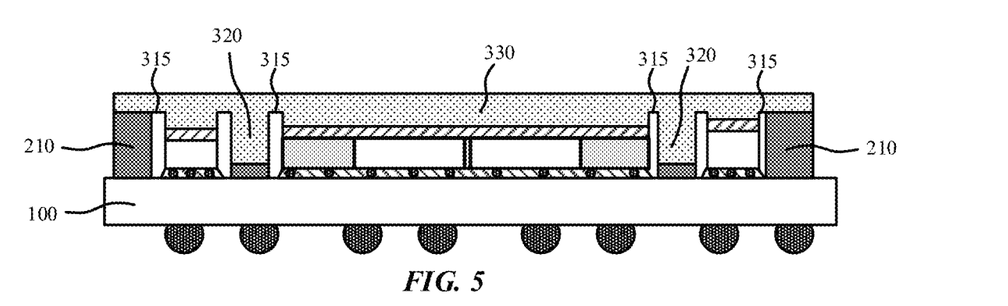
FIG. 5 is a schematic cross-sectional side view illustration of a partial trenched design of a lid on an outer support in accordance with an embodiment.

FIG. 5 is a schematic cross-sectional side view illustration of a partial trenched design of a lid on an outer support in accordance with an embodiment. As shown, the outer support 210 is joined to the lid 300 within the trench. The lid 300 additionally includes an inner wall 320 joined to the inner support 220. In the illustrated embodiment the outer support 210 is taller than the inner support 220. Also shown in FIG. 5, the inner wall 320 extends from the trench 315. In an embodiment, the lid 300 can include both outer walls 310 and inner walls 320 extending from a trench 315.

Figure 6:
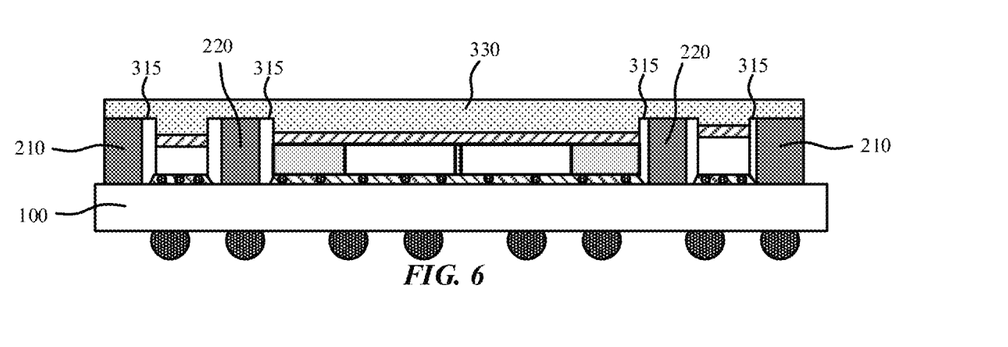
FIG. 6 is a schematic cross-sectional side view illustration of a partial trenched design of a lid on both an inner and outer support in accordance with an embodiment.

FIG. 6 is a schematic cross-sectional side view illustration of a partial trenched design of a lid on both an inner and outer support in accordance with an embodiment. FIG. 6 is similar to the embodiment illustrated in FIG. 3 with the addition of the inner support 220 also joined to the lid within a trench 315, which may be the same trench or a separate trench than the trench 315 where the outer support 210 is joined to the lid.

Figure 7:
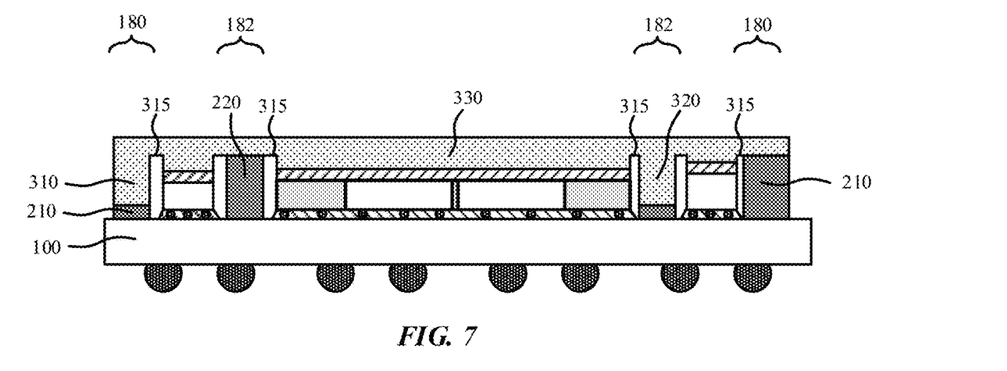
FIG. 7 is a schematic cross-sectional side view illustration of a partial trenched design of a lid on an inner or outer support in accordance with an embodiment.

FIG. 7 is a schematic cross-sectional side view illustration of a partial trenched design of a lid on an inner or outer support in accordance with an embodiment. As shown, FIG. 7 combines features of FIGS. 4-6 to show a variety of configurations are possible, where portions of the inner support 220 and outer support 210 can have different heights, and outer wall 310 and inner wall 320 can be discontinuous.

The trenched lid designs in accordance with embodiments can reduce the volume of lid at the connection areas to reduce stress and warpage caused by the lid. Furthermore, the reduction of volume of the lid can correspond to an increase in volume (height) of a stiffener structure, which increases the volume ratio of the stiffener structure to lid. In the illustrated embodiments, the ratio of stiffener structure to lid is greater than 1, meaning the stiffener structure can be taller than a thickness of the trenched roof of the lid.

In accordance with embodiments the stiffener structure can be fully or partially formed of a low CTE material. In an exemplary implementation a low CTE stiffener material can be a nickel-iron alloy (FeNi36), iron-nickel-cobalt alloy (sold under the trademark KOVAR, trademark of CRS Holdings, Inc., Delaware), iron-nickel alloy (Alloy42), stainless steels (SUS410, SUS430), etc. while the lid is formed of a higher CTE material such as copper. The stiffener structure can also be formed of different materials (different chemical composition, or alloy ratios) to tune stress and warpage.

Figure 8:
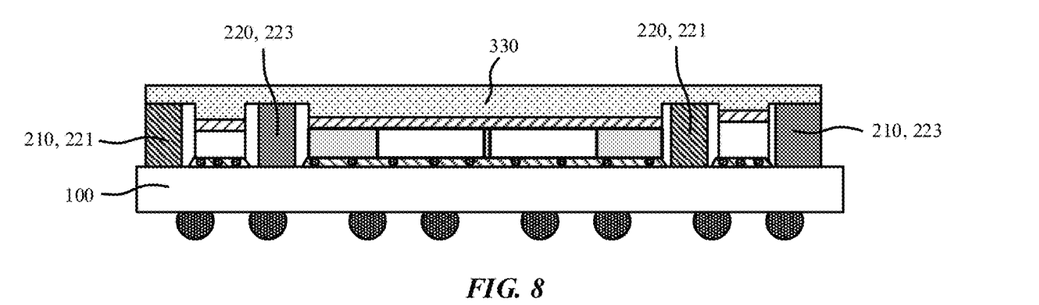
FIG. 8 is a schematic cross-sectional side view illustration of a stiffener structure formed of adjacent materials with different coefficients of thermal expansion in accordance with an embodiment.

FIG. 8 is a schematic cross-sectional side view illustration of a stiffener structure formed of adjacent materials with different coefficients of thermal expansion in accordance with an embodiment. For example, the outer support 210 and the inner support 220 can be formed of different materials 221, 223 with a different CTE. Also, different areas of the outer support 210 and inner support 220 can be formed of different materials 221, 223 to locally tune stress and warpage.

Figure 9:
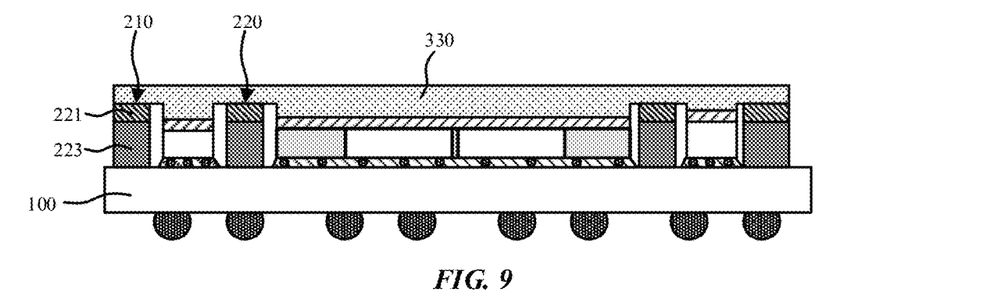
FIG. 9 is a schematic cross-sectional side view illustration of a stiffener structure formed of stacked materials with different coefficients of thermal expansion in accordance with an embodiment.

FIG. 9 is a schematic cross-sectional side view illustration of a stiffener structure formed of stacked materials 221, 223 with different coefficients of thermal expansion in accordance with an embodiment. Furthermore, the relative thickness of the stacked materials 221, 223 can be different in different areas of the outer support 210 and inner support 220.

The lids in accordance with embodiments may also have a plurality of physically separate pieces. Such multiple piece lid designs may reduce the coupling effect of the lid to the rest of the module, and further reduce stress caused by the lid. This may include a reduction of die-to-die molding compound stress, and module warpage.

Figure 10A:
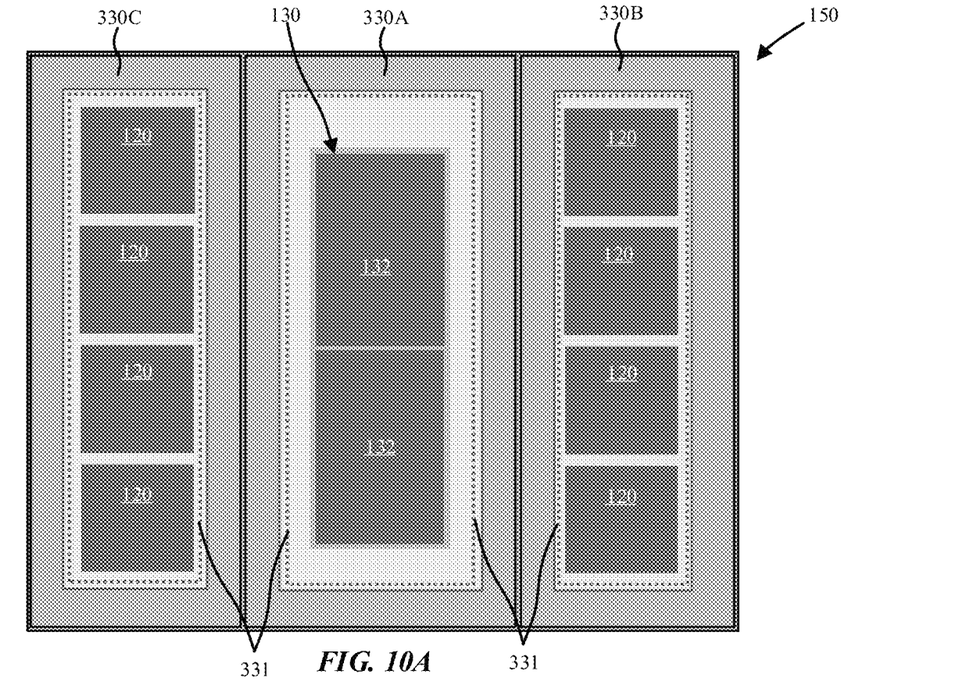
FIG. 10A is a schematic top view illustration of a multiple chip module with multiple piece lid in accordance with an embodiment.
Figure 10B:
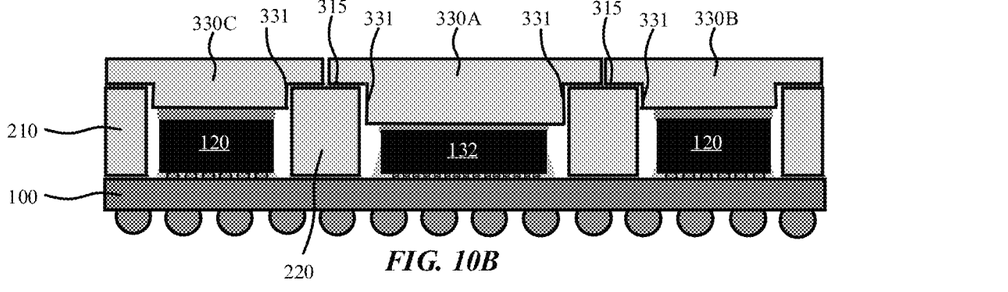
FIG. 10B is a schematic cross-sectional side view illustration of a multiple piece lid with trench design roof components in accordance with an embodiment.
Figure 10C:
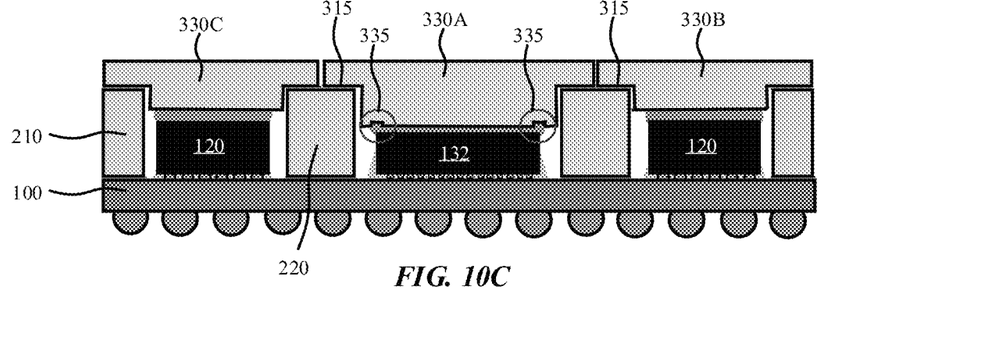
FIG. 10C is a schematic cross-sectional side view illustration of a multiple piece lid with a component cavity in accordance with an embodiment.

Referring now to FIGS. 10A-10C schematic top view and cross-sectional side view illustrations are provided of a multiple piece lid in accordance with embodiments. In the illustrated embodiment the lid 300 may include a plurality of physically separate roofs 330A, 330B, 330C bonded to the stiffener structure 200. The roofs 330A, 330B, 330C may additionally have a trench design including trenches 315. In the illustrated embodiments, trenches 315 may be formed along the sides of the roofs 330A, 330B, 330C such that a pair of roofs are bonded to each inner support 220, and a single roof is bonded to each outer support 210. Each lid may be anchored to its surrounding inner support 220, and/or outer support 210. In the particular embodiment illustrated in FIG. 10C, the lid may further include a component recess 335 which mates with a component (e.g. second component 130) edges. The component recess 335 may promote coverage of the TIM 170 with the component edges and reduce TIM peeling stress.

Figure 11A:
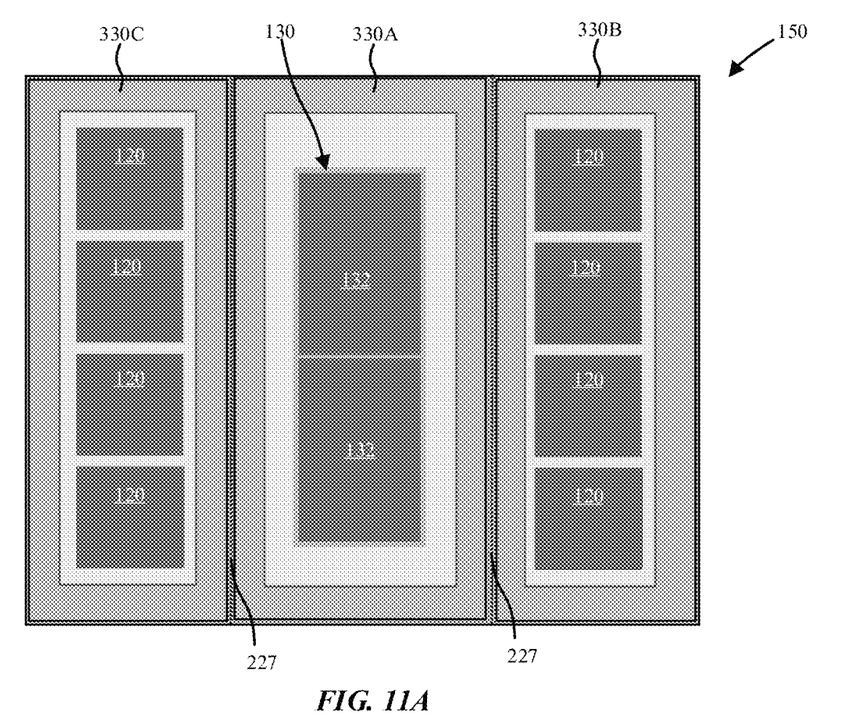
FIG. 11A is a schematic top view illustration of a multiple chip module with multiple piece lid in accordance with an embodiment.
Figure 11B:
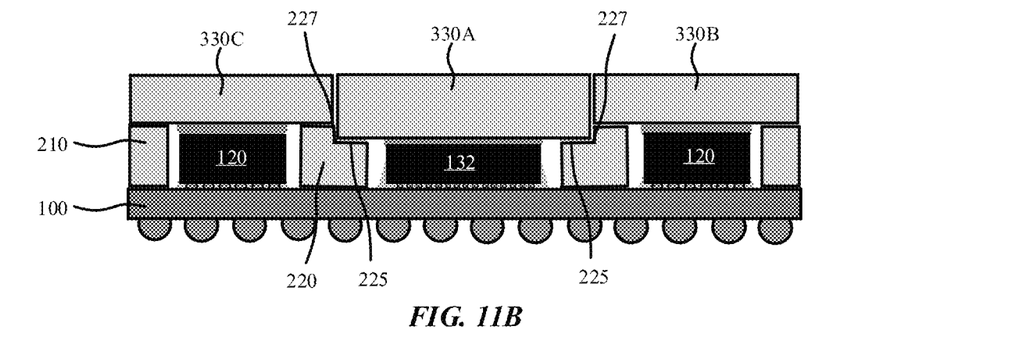
FIG. 11B is a schematic cross-sectional side view illustration of a multiple piece lid with trench design wall components in accordance with an embodiment.

Referring now to FIGS. 11A-11B schematic top view and cross-sectional side view illustrations are provided of a multiple piece lid in accordance with embodiments. FIGS. 11A-11B differ from the embodiment of FIGS. 10A-10B in that the trenches 225 are formed within the inner support 220 and/or outer support 210 as opposed to the roofs of the lid. Similarly, trenches 225 may include trench edges 227. In the particular embodiment illustrated, the inner supports 220 include trenches 225 to accommodate a roof 330A of lid 300. The physically separate roofs 330A, 330B, 330C of FIG. 11A-11B may have different thicknesses to manage stress and warpage.

Figure 12A:
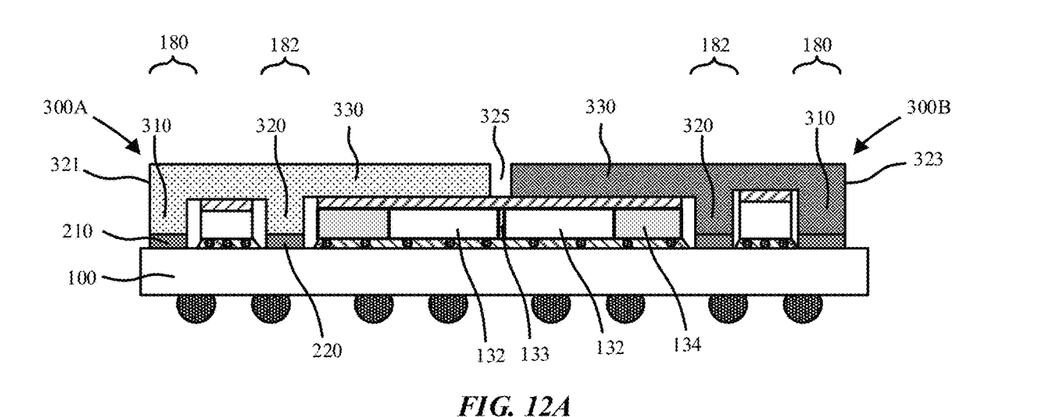
FIGS. 12A-12B are a schematic cross-sectional side view illustrations of multiple piece lids formed of different materials in accordance with an embodiment.
Figure 12B:
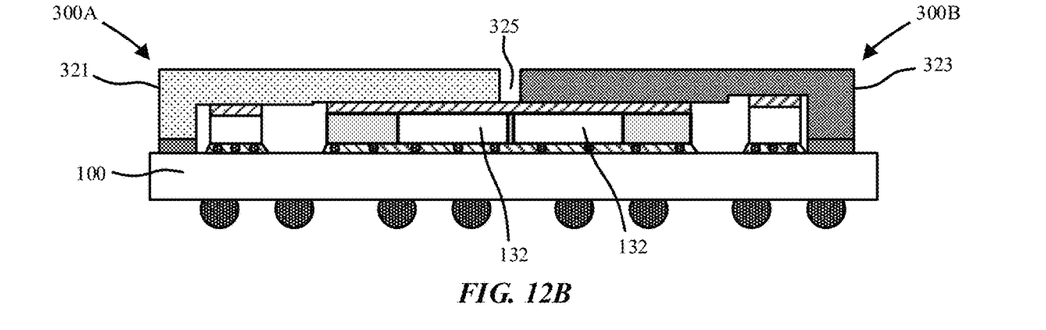
Figure 12C:
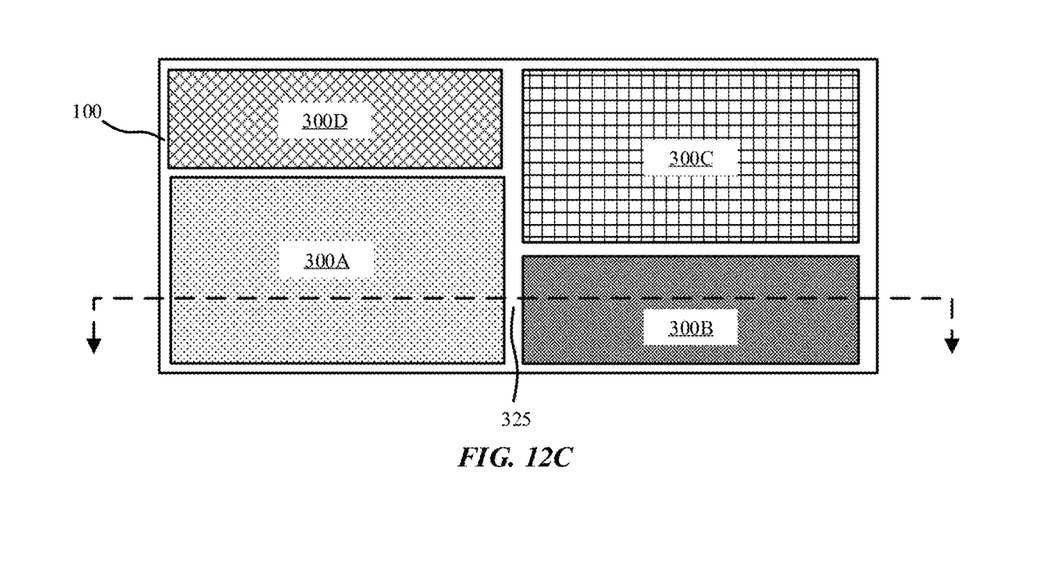
FIG. 12C is a schematic top view illustration of a multiple piece lid formed of different materials in accordance with an embodiment.

The multiple piece lid designs in accordance with embodiments may also include inner and/or outer walls. Referring now to FIGS. 12A-12C schematic cross-sectional side view and top view illustrations are provided of multiple piece lids in accordance with an embodiment. It is to be appreciated that while illustrated and described separately, that the multiple piece lid embodiments of FIGS. 12A-12C are combinable with the multiple piece lid embodiments of FIGS. 10A-11B, as well as other embodiments described herein.

Figure 13A:
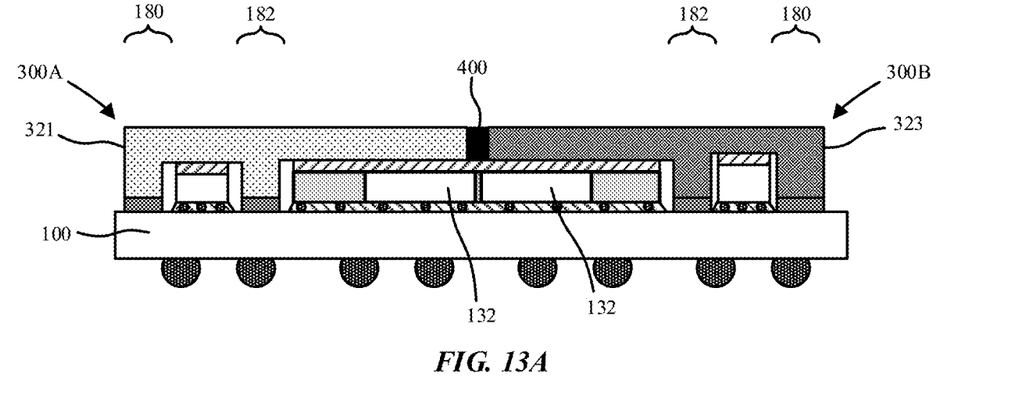
FIG. 13A is a schematic cross-sectional side view illustration of a multiple piece lid with sealed gap in accordance with an embodiment.
Figure 13B:
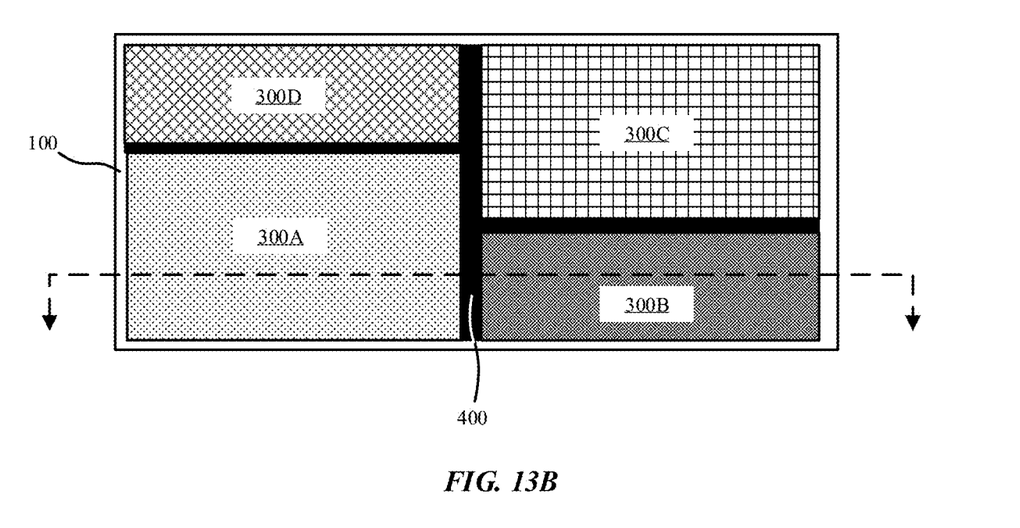
FIG. 13B is a schematic top view illustrations of a multiple piece lid with sealed gap in accordance with an embodiment.

As shown the multiple piece lid 300 may include a first lid piece 300A spanning over a first die 132 in the second component 130 and a second lid piece 300B spanning over a second die 132 in the second component 130. Multiple lid pieces may be included 300A, 300B, 300C, 300D, etc. As shown, the molding compound 134 may fill a space 133 laterally between the first die 132 and the second die 132, which can correspond to a high stress region. A gap 325 may be located between the first lid piece 300A and the second lid piece 300B. In the illustrated embodiment the gap 325 is directly above the space 133 that is laterally between the first die 132 and the second die 132 of the component 130, which may be filled with the molding compound 134. The gap 325 may further reduce the coupling effect of the lid to the rest of the module, and further reduce stress caused by the lid. In accordance with embodiments, the separate lid pieces 300A, 300B, etc. may be formed of different materials 321, 323. Use of different lid material may be tuned to meet different mechanical and thermal requirements of the microelectronic module. The gap 325 may optionally be filled as shown in FIGS. 13A-13B with a fill material 400. For example, the fill material may be a solder, adhesive, etc.

Figures 14A, 14B, 14C:
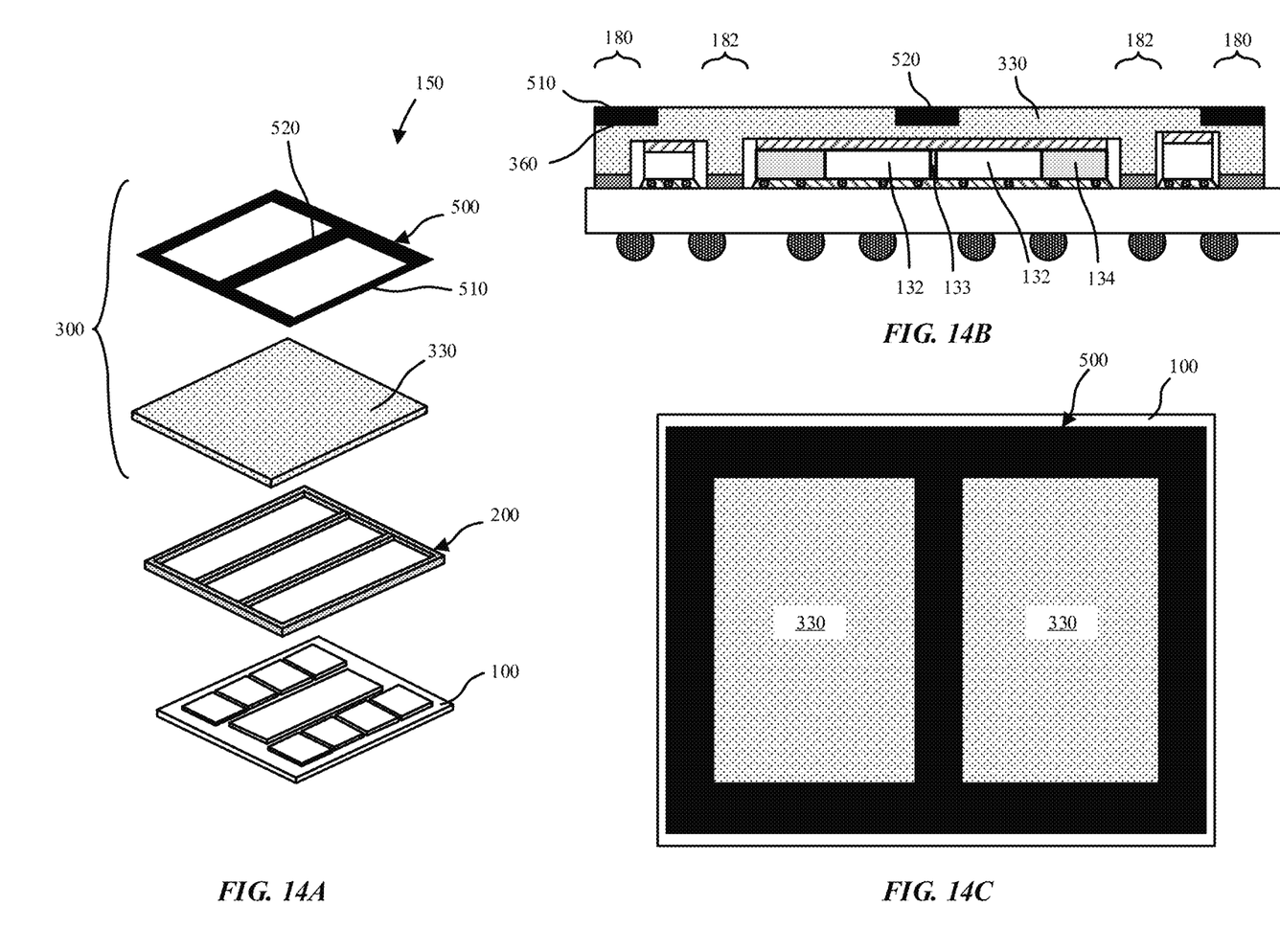
FIG. 14A is an exploded isometric view illustration of a multiple chip module including a hybrid lid design in accordance with an embodiment.
FIG. 14B is a schematic cross-sectional side view illustration of a multiple chip module including a hybrid lid design in accordance with an embodiment.
FIG. 14C is schematic top view illustration of a multiple chip module including a hybrid lid design in accordance with an embodiment.

Referring now to FIGS. 14A-14C exploded isometric, schematic cross-sectional side view, and top view illustrations are provided of a multiple chip module including a hybrid lid design in accordance with embodiments. In addition, or alternative to, the aforementioned structures a hybrid lid 300 design can include different materials bonded together or embedded, one within the other. By combining different materials, the effective CTE and stiffness of the lid can be tuned to match the target mechanical and thermal performance. In an embodiment, a lid 300 may include a first lid pattern 500 bonded to a roof 330 of a main lid structure, wherein the first lid pattern 500 has a different CTE than the main lid structure. The main lid structure may be similar to the previously described lids 300 with the addition of a female pattern 360 into which the first lid pattern 500 is secured. The first lid pattern 500 may include a variety of features, which may optionally include an inner rib 520 and outer (peripheral) contour 510. The first lid pattern 500 may be located at high stress regions, such as at connection areas (180, 182) and over the space between side-by-side dies. In an embodiment, the inner rib 520 is directly over the space 133 between adjacent dies 132.

Figure 15A:
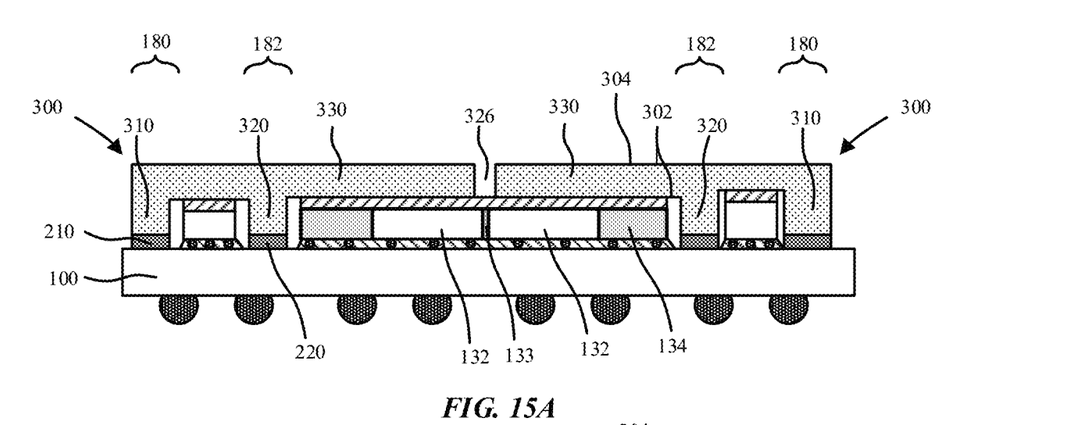
FIG. 15A is a schematic cross-sectional side view illustration of a lid design on an inner and outer support and including a local opening in accordance with an embodiment.
Figure 15B:
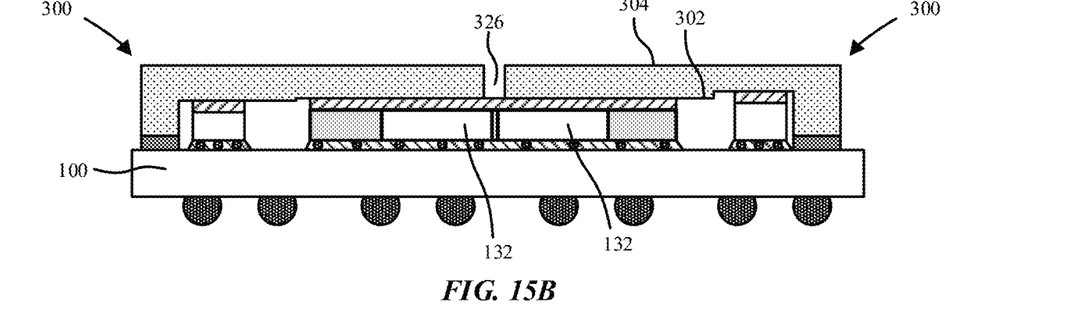
FIG. 15B is a schematic cross-sectional side view illustration of a lid design on an outer support and including a local opening in accordance with an embodiment.
Figure 15C:
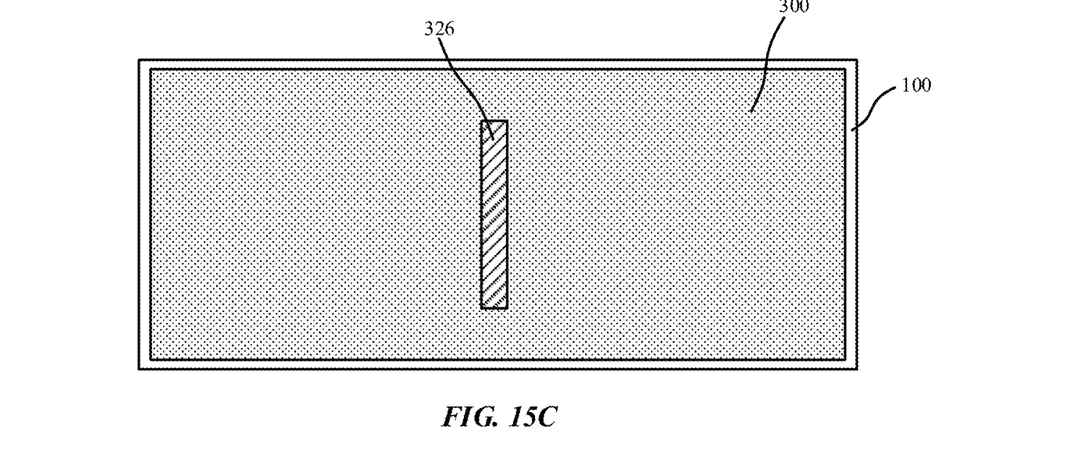
FIG. 15C is a schematic top view illustration of the lid design including a local opening over a module substrate in accordance with an embodiment.

Up until this point the lid structures have been illustrated and described as being single or multiple piece lid arrangements. In accordance with embodiments, one or more local openings may be formed in any of the lid structures to reduce stress and warpage. FIGS. 15A-15C illustrate an exemplary implementation of such a local opening 326. As shown, FIGS. 15A-15C are similar to the lid design previously illustrated and described with regard to FIGS. 2A-2C, though embodiments are not so limited. In an embodiment, the one or more local openings 326 may be located directly above (over) the space 133 laterally between dies 132. The one or more local opening 326 may completely or partially overlap the space 133. One or more local openings can also be located over other regions to mitigate stress. In an embodiment, the one or more local openings 326 are formed completely through the roof 330 of the lid from the top side 304 to the bottom surface 302 of the roof 330.

Figure 16A:
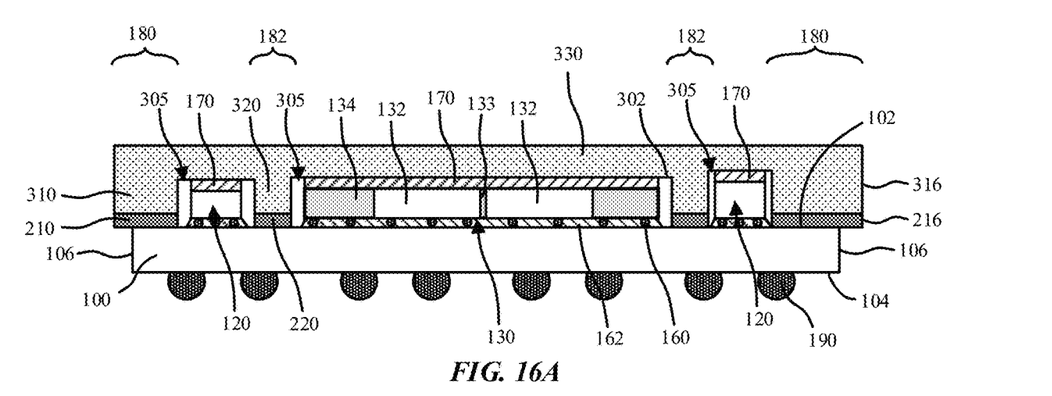
FIG. 16A is a schematic cross-sectional side view illustration of a lid design on an inner and outer support with the outer connection area overhanging a module substrate in accordance with an embodiment.
Figure 16B:
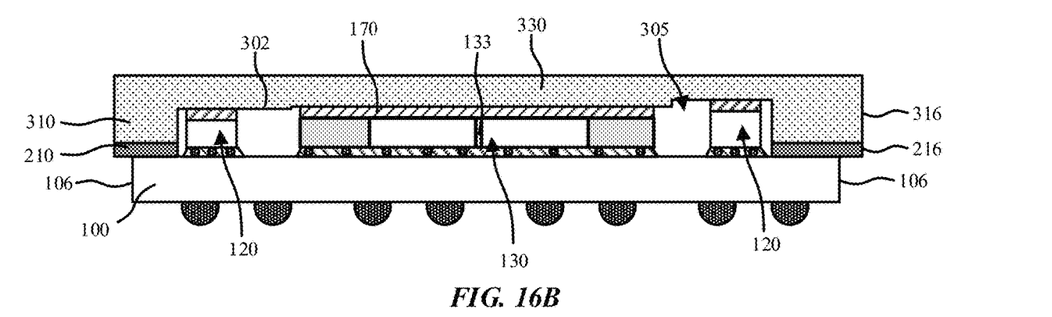
FIG. 16B is a schematic cross-sectional side view illustration of a lid design on an outer support with the outer connection area overhanging a module substrate in accordance with an embodiment.

The stiffener structure(s) 200 and/or lid(s) 300 can also be designed to overhang peripheral edges of module substrate 100 to reduce stress and warpage. FIG. 16A is a schematic cross-sectional side view illustration of a lid design on an inner and outer support with the outer connection area 180 overhanging the module substrate 100 in accordance with an embodiment. FIG. 16B is a schematic cross-sectional side view illustration of a lid design on an outer support with the outer connection area 180 overhanging the module substrate 100 in accordance with an embodiment. The particular embodiments illustrated in FIGS. 16A-16B are similar to those previously illustrated and described with regard to FIGS. 2A-2B, however, this is merely exemplary and the overhanging designs are combinable with any of the stiffener structure 200 inner and outer supports 220, 210, and lid 300 combinations with corresponding inner walls 320 and outer walls 310. The overhanging designs are also compatible with the multiple piece lid structures described herein.

Figure 16C:
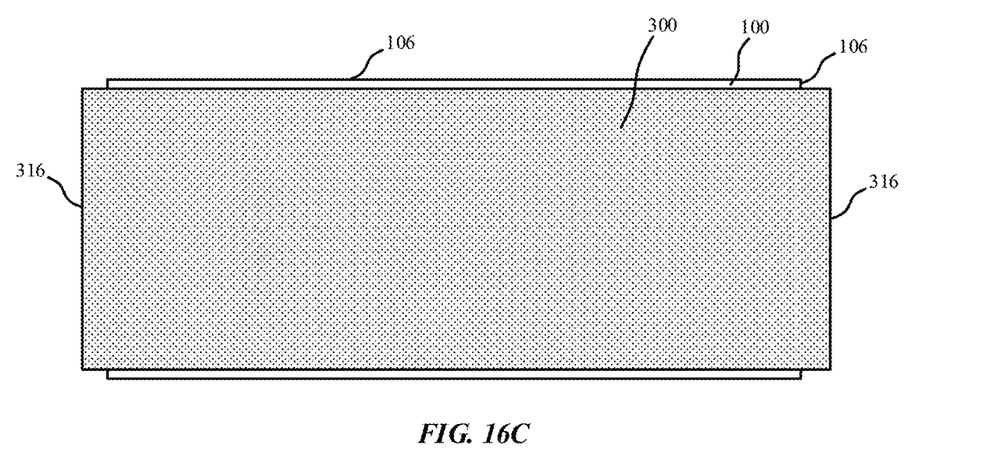
FIG. 16C is a schematic top view illustration of the lid design including an outer connection area overhanging a module substrate in one direction in accordance with an embodiment.
Figure 16D:
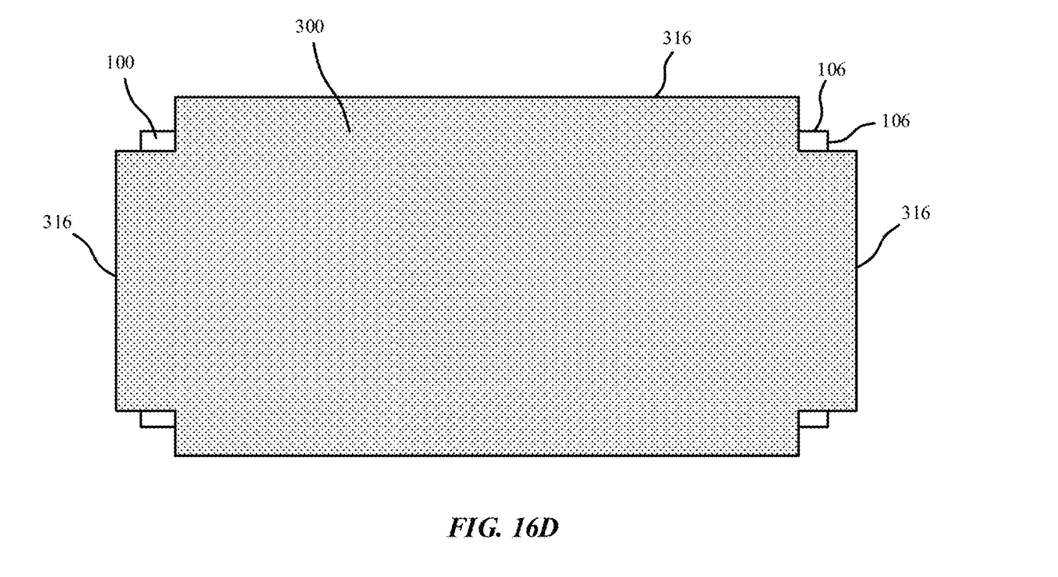
FIG. 16D is a schematic top view illustration of the lid design including an outer connection area overhanging a module substrate in multiple directions in accordance with an embodiment.

The overhanging lid designs in accordance with embodiments may overhang one or more, or all, peripheral (lateral) edges 106 of the module substrate 100. In particular, one or more peripheral edges 216 of the stiffener structure 200 and/or peripheral edges 316 of the lid(s) 300 corresponding to the outer connection areas 180 may overhang one or more peripheral edges 106 of the module substrate. Specifically, the peripheral edges 216 of the outer supports 210 and peripheral edges 316 of the outer walls 310 of the lids 300 may overhang the peripheral edges 106 of the module substrate 100. FIG. 16C is a schematic top view illustration of the lid 300 design including an outer connection area overhanging a module substrate in one direction in accordance with an embodiment. As shown, the peripheral edges 316 of the lid 300 outer walls 310 extend laterally past the peripheral edges 106 on two opposite sides of the module substrate 100. FIG. 16D is a schematic top view illustration of the lid 300 design including an outer connection area overhanging a module substrate in multiple directions in accordance with an embodiment. As shown, the peripheral edges 316 of the lid 300 outer walls 310 extend laterally past the peripheral edges 106 on four sides of the module substrate 100. While not visible in the top view illustrations of FIGS. 16C-16D, the peripheral edges 216 of the stiffener structure 200 outer supports 210 can be similarly oriented, or alternatively oriented if the lid 300 does not include outer walls 310. It is to be appreciated the particular orientations of FIGS. 16B-16C are exemplary and various alternative arrangements are possible with the outer connection areas to overhang one or more peripheral edges 106 of the module substrate. Additionally, the outer connection areas 180 may partially or fully overhang a length of any of the peripheral edges 106 of the module substrate 100.

Figure 16E:
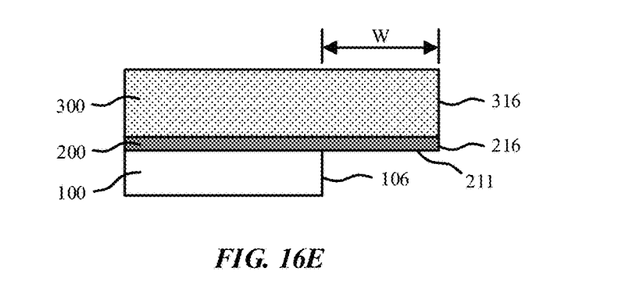
FIG. 16E is a close up schematic cross-sectional side view illustration of a lid and support structure overhanging a module substrate in accordance with an embodiment.

Referring now to FIG. 16E a close up schematic cross-sectional side view illustration is provided of a lid 300 and support structure 200 overhanging a module substrate in accordance with an embodiment. In such a configuration, the bottom side 211 of the support structure 200 may be level, or planar. As shown, the peripheral edges 216, 316 of the support structure 200 and lid 300 overlap (or extend past) the peripheral edge 106 of the module substrate 100 by a width (W). The support structure 200 and/or lid 300 may also have an L-shape configuration where a hanging portion of the support structure and/or lid 300 is laterally adjacent to a peripheral edge 106 of the module substrate 100. In such configurations the bottom side 211 of the support structure 200 or the bottom side 311 of the lid 300 can have an L-shape profile.

Figure 16F:
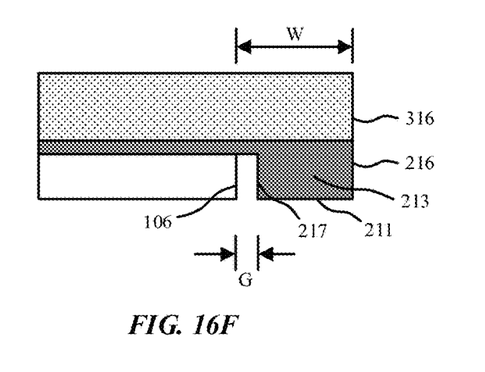
FIG. 16F is a close up schematic cross-sectional side view illustration of an L-shaped support structure overhanging a module substrate in accordance with an embodiment.

FIG. 16F is a close up schematic cross-sectional side view illustration of an L-shaped support structure 200 overhanging a module substrate 100 in accordance with an embodiment. As shown, the support structure 200 may overlap (or extend past) the peripheral edge 106 of the module substrate 100 by a width (W), and also include a hanging portion 213 that protrudes downward and is laterally adjacent the peripheral edge 106 of the module substrate 100. The hanging portion 213 may include an inside edge 217 that is separated from the peripheral edge 106 by a gap (G).

Figure 16G:
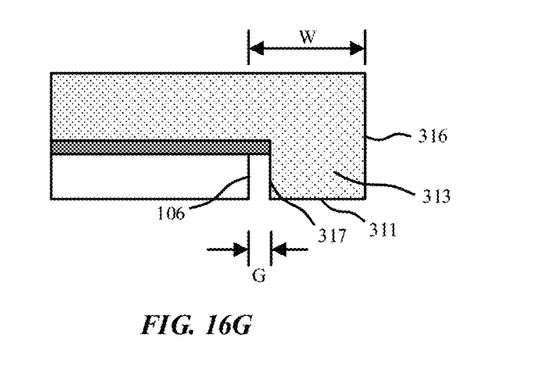
FIG. 16G is a close up schematic cross-sectional side view illustration of an L-shaped lid overhanging a module substrate in accordance with an embodiment.

FIG. 16G is a close up schematic cross-sectional side view illustration of an L-shaped lid 300 overhanging a module substrate 100 in accordance with an embodiment. As shown, the lid 300 may overlap (or extend past) the peripheral edge 106 of the module substrate 100 by a width (W), and also include a hanging portion 313 that protrudes downward and is laterally adjacent the peripheral edge 106 of the module substrate 100. The hanging portion 313 may include an inside edge 317 that is separated from the peripheral edge 106 by a gap (G).

In utilizing the various aspects of the embodiments, it would become apparent to one skilled in the art that combinations or variations of the above embodiments are possible for integrating an MCM lid structure while mitigating module warpage. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:
1. A module comprising:
a module substrate;
a first component on a top side of the module substrate;
a second component on the top side of the module substrate, the second component including peripheral lateral edges;
a stiffener structure mounted on the top side of the module substrate; and
a lid mounted on the stiffener structure and covering the first component and the second component;
wherein the lid includes a roof, a bottom surface of the roof, a trench in the bottom surface, and a component recess in the bottom surface, and wherein the component recess mates with the peripheral lateral edges of the second component, the component recess is separate from the trench, and the stiffener structure is joined to the lid within the trench; and
a thermal interface material that secures a top side of the second component to the bottom surface of the roof, wherein the thermal interface material is additionally located within the component recess in the bottom surface of the roof that mates with the peripheral lateral edges of the second component.

2. The module of claim 1, wherein the stiffener structure includes an outer periphery support and an inner support.

3. The module of claim 2, wherein the inner support is joined to the lid within the trench formed in the roof of the lid.

4. The module of claim 2, wherein the outer periphery support is joined to the lid within a second trench formed in a roof of the lid.

5. The module of claim 2, wherein the stiffener structure is formed of a material with a lower CTE than the lid and/or wherein the outer periphery support and the inner support of the stiffener structure comprise different materials with a different CTE.

6. The module of claim 2, wherein the lid comprises physically separate pieces.

7. The module of claim 6, wherein the second component comprises a first die and a second die encapsulated within a molding compound and the molding compound fills a space laterally between the first die and the second die.

8. The module of claim 7, wherein the lid includes a first lid piece spanning over the first die and a second lid piece spanning over the second die.

9. The module of claim 8, wherein the first lid piece has a different chemical composition than the second lid piece.

10. The module of claim 8, further comprising a gap between the first lid piece and the second lid piece, wherein the gap is directly above the space laterally between the first die and the second die, and preferably wherein the gap is filled.

11. The module of claim 1, wherein the thermal interface material is located at least partially along the peripheral lateral edges of the second component.

12. The module of claim 11, wherein:
the stiffener structure includes an outer periphery support and an inner support;
the outer periphery support is joined to the lid within a trench formed in a roof of the lid;
the inner support is joined to the lid within a second trench formed in the roof of the lid.

13. A module comprising:
a module substrate;
a first component on a top side of the module substrate;
a second component on the top side of the module substrate;
a stiffener structure mounted on the top side of the module substrate, wherein the stiffener structure includes an outer periphery support and an inner support; and
a lid mounted on the stiffener structure and covering the first component and the second component;
wherein the lid includes a component recess that mates with peripheral edges of the second component.

14. The module of claim 13, wherein the outer periphery support is joined to the lid within a trench formed in a roof of the lid.

15. The module of claim 14, wherein the inner support is joined to the lid within a second trench formed in a roof of the lid.

16. The module of claim 13, further comprising a thermal interface material securing the second component to the lid, wherein the thermal interface material is located within the component recess in the lid and at least partially along the peripheral edges of the second component.

* * * * *